United States Patent [19]

Clemens

[11] Patent Number: 5,019,940
[45] Date of Patent: May 28, 1991

[54] MOUNTING APPARATUS FOR ELECTRONIC DEVICE PACKAGES

[75] Inventor: Donald L. Clemens, The Colony, Tex.

[73] Assignee: Thermalloy Incorporated, Dallas, Tex.

[21] Appl. No.: 128,390

[22] Filed: Dec. 3, 1987

Related U.S. Application Data

[63] Continuation of Ser. No. 17,915, Feb. 24, 1987, abandoned.

[51] Int. Cl.[5] .............................................. H05K 7/20
[52] U.S. Cl. .................................. 361/386; 165/80.3; 174/16.3
[58] Field of Search ...................... 165/80.2, 80.3, 185; 174/16 HS, 52 FP; 361/383, 386, 387, 388, 400, 405, 417, 419; 357/81, 79

[56] References Cited

U.S. PATENT DOCUMENTS

| | | | |
|---|---|---|---|
| 4,117,257 | 9/1978 | Thomas | 174/16 HS |
| 4,167,031 | 9/1979 | Patel | 174/16 HS |
| 4,321,423 | 3/1982 | Johnson | 174/16 HS |
| 4,403,102 | 9/1983 | Jordan | 361/388 |
| 4,504,886 | 3/1985 | Cygan | 361/386 |
| 4,539,621 | 9/1985 | Currier | 361/386 |
| 4,546,408 | 10/1985 | Rodseth | 361/386 |
| 4,625,260 | 11/1986 | Jordan | 361/386 |
| 4,660,123 | 4/1987 | Hermann | 361/386 |
| 4,716,494 | 12/1987 | Bright | 174/16 HS |

Primary Examiner—Gerald P. Tolin
Attorney, Agent, or Firm—Richards, Medlock & Andrews

[57] ABSTRACT

Disclosed is apparatus for mounting an electronic device package on a printed circuit board or the like. The apparatus includes a frame for receiving the electronic device package with the leads of the electronic device package presented for solderable connection to preformed locations on the printed circuit board. Solderable means are provided to mount the frame and the electronic device package on the printed circuit board. A clip engaging a heat sink is secured to the frame to urge the heat sink into intimate thermal contact with the electronic device package.

24 Claims, 1 Drawing Sheet

MOUNTING APPARATUS FOR ELECTRONIC DEVICE PACKAGES

This is a continuation of application Ser. No. 017,915 filed Feb. 24, 1987 and now abandoned entitled Mounting Apparatus For Electronic Device Packages.

This invention relates generally to electronic component assemblies. More particularly, it relates to apparatus for mounting electronic device packages on printed circuit boards an the like.

Although it has become conventional practice to mount electronic device packages and heat sinks on circuit media such as printed circuit boards and the like, various device packages, because of unique peculiarities, pose unique problems. For example, a typical gate array package comprises a relatively thin rectangular housing containing a semiconductor device with plurality of rigid leads electrically connected to the semiconductor device extending downwardly from a lower surface of the housing. The gate array is usually mounted on a printed circuit board or similar structure by inserting each of the leads into an aligned preformed hole in the printed circuit board and soldering the leads therein. The leads thus simultaneously function as mechanical support for the electronic device package and as electrical interconnection between the electronic device and the circuit on the printed circuit board.

Frequently an electronic device package generates so much heat during use that a heat sink is required to rapidly dissipate the heat. For purposes of this invention, a heat sink is any body of metal or like material in contact with an electronic device package for transferring heat from the device contained in the electronic device package and rapidly dissipating the heat to the environment.

Finned heat sinks have been found to be particularly effective when used with gate array packages. A finned heat sink usually consists of a central post having a plurality of longitudinally spaced fins extending radially from the post. One end of the post is placed in contact with the housing of the gate array so that heat generated by the semiconductor device is conveyed through the post and dissipated into the environment by the large surface area of the fins.

Conventional approaches for mounting electronic device packages such as gate arrays on printed circuit boards and the like exhibit several limitations. The leads are frequently subjected to excessive mechanical loads, particularly when supporting not only the electronic device package but also a relatively massive heat sink. If the leads are damaged by these forces the electrical connection between the electronic device package and the circuit on the printed circuit board may be broken.

It has also proven difficult to mount a heat sink in intimate thermal contact with the electronic device package. Various means have been used in the past such as gluing or otherwise adhesively attaching the heat sink to the electronic device package. However, the assembly of a heat sink and an electronic device package using adhesives is messy, tedious, labor intensive and therefore expensive. This is a particular problem when attaching a finned heat sink to a gate array. Many of the commonly used adhesives emit fumes or otherwise constitute undesirable health hazards. Frequently it is necessary to cure the glue at elevated temperatures for extended periods of time, further increasing manufacturing costs. It is also sometimes desirable to remove the heat sink from the electronic device package for repair or replacement. This is extremely difficult if not impossible to accomplish when the heat sink is adhesively mounted on the electronic device package.

This invention provides apparatus for mounting electronic device packages on printed circuit boards and the like. The apparatus permits mounting a heat sink in intimate thermal contact with the electronic device package and includes a frame having a cavity for receiving the electronic device package with the leads of the electronic device package extending downwardly through the frame; means for solderably mounting the frame to a preformed location on a printed circuit board; clip means for engaging the heat sink when located on the electronic device package to urge the heat sink into intimate thermal contact with the electronic device package; and means for securing the heat sink clip to the frame. Alternatively, the heat sink may be omitted and the heat sink clip used to directly secure the electronic device package to the frame. The invention thus provides apparatus with the unique ability to removeably mount a heat sink and electronic device package on a circuit board with relative ease yet securely maintain the heat sink in intimate thermal contact with the device package.

So that the manner in which the above recited features and advantages of the invention, as well as others which will become apparent to those skilled in the art, are obtained and can be understood in detail, a more particular description of the invention briefly summarized above may be had by reference to the accompanying drawing, which drawing forms a part of the specification and in which like numerals depict like parts in the several views. It is to be noted, however, that the appended drawing illustrates only preferred embodiments of the invention and is therefore not to be considered limiting of its scope, for the invention may admit to other equally effective embodiments.

Figure 1:
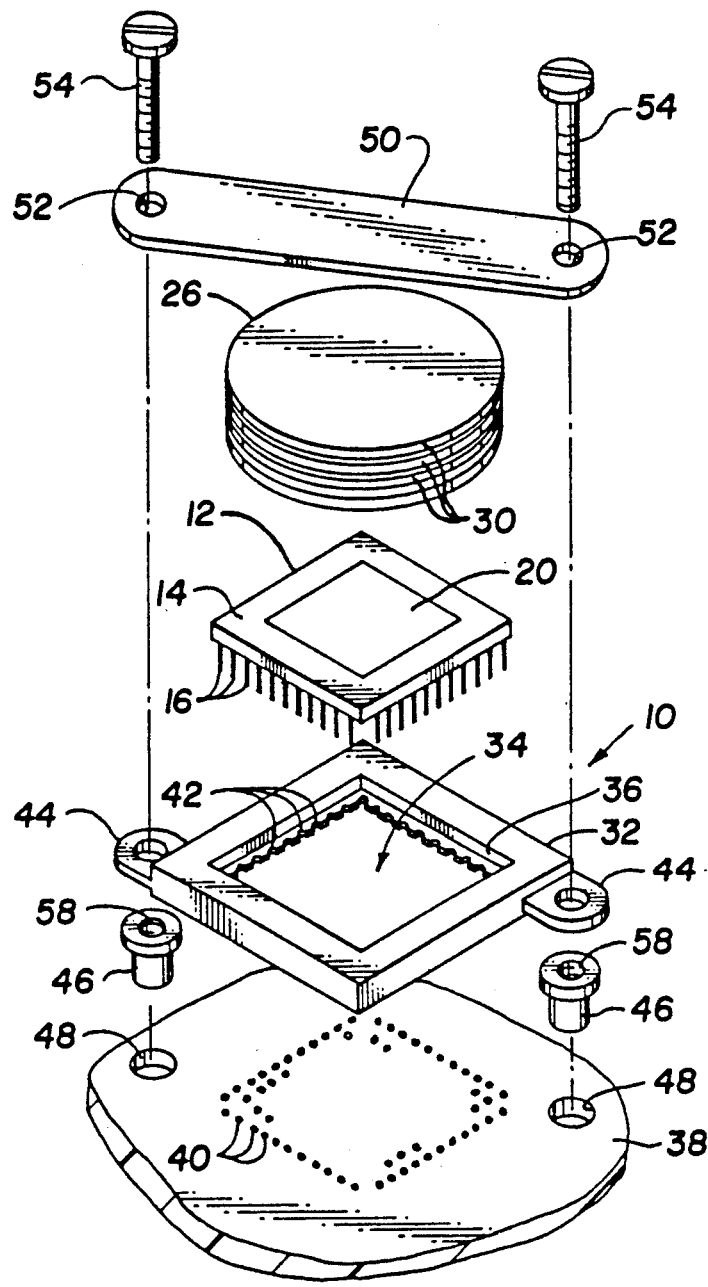
FIG. 1 is an exploded view of apparatus according to the invention for securing a gate array and a finned heat sink to a circuit board.
Figure 2:
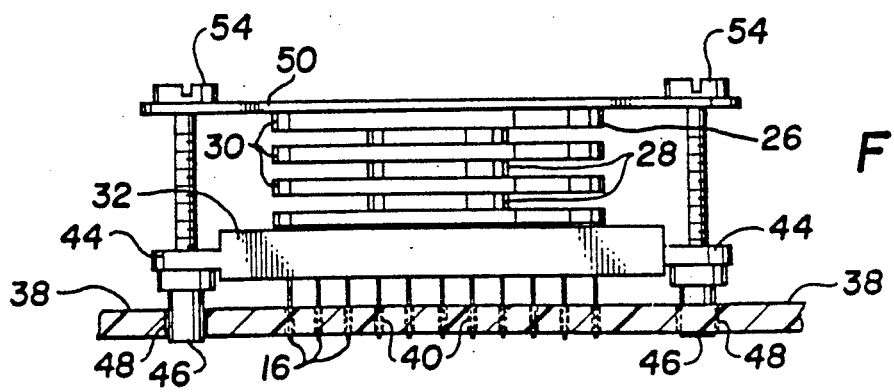
FIG. 2 is a side view, partially in cross-section, of the apparatus of FIG. 1 mounting a gate array and a heat sink on a printed circuit board.

Referring now to FIGS. 1 and 2, the reference numeral 10 generally indicates the mounting apparatus of the invention. The apparatus is used in conjunction with gate array 12 having a rectangular housing 14 and a plurality of downwardly depending leads 16 projecting from a lower surface (not shown) of the housing. Pad 20 is formed on upper surface of the housing 14 and is in thermal contact with a semiconductor device (not shown) contained within the housing for rapidly transferring heat generated by the semiconductor device to the exterior of the gate array package. Alternatively, gate arrays may be constructed without pads on their upper surfaces.

Finned heat sink 26 is provided for use with gate array 12. The finned heat sink 26 includes post 28 having one end in thermal contact with pad 20 of the gate array. A plurality of spaced fins 30 project radially from the post and collectively present a large surface area for dissipating heat from the gate array through the heat sink.

The mounting apparatus includes a frame 32 having a cavity 34 for receiving the gate array 12 in close confinement about the side edges or perimeter of the gate array housing. The frame is preferably constructed of electrically insulating material such as nytron or deirin which is readily molded or manufactured to conform to a desired shape. Cavity 34 includes inwardly extending shoulder 36 for contacting the lower surface of the gate array housing and supporting the gate array in a predetermined position within the cavity with the leads 16 of the gate array extending downwardly for presentation to aligned preformed locations on printed circuit board 38. The preformed locations on the printed circuit board are holes 40 extending through the printed circuit board for receipt of the leads and soldering therein such as by mass soldering techniques known in art. Alternatively, the leads of the electronic device package could be constructed for soldering to the surface of the printed circuit board as is disclosed in U.S. Pat. No. 4,625,260 entitled Fasteners for Surface Mounting of Printed Circuit Board Components which issued Nov. 25, 1986 to Jordan, et al. The inner edge of the cavity 34 includes a plurality of semi-circular notches 42. Each of the notches 42 is aligned with one of the outermost downwardly depending leads 16 of the gate array when the gate array is located in the cavity of the frame. The notches 42 thus assist in aligning the gate array housing with respect to the frame.

Means for mounting the frame 32 on printed circuit board 38 includes a pair of spaced latching members 44 projecting from the perimeter of the frame and preferably forming an integral part of the frame. Specifically, the latching members 44 are located on opposite corners of the frame, each defining an opening. If desired, the latching members may be formed on opposite sides of the frame rather then on opposite corners as illustrated. The mounting means illustrated includes a pair of solderable nuts 46 secured within the holes in the latching means 44. Solderable nuts 46 are internally threaded cylinders with a solderable coating on the external surface. Accordingly, the nuts 46 may be solderable within the holes 48 in the circuit board by conventional wave soldering or the like to secure the frame 32 to the circuit board simultaneously with securing the leads 16 to the circuit board. Alternatively, solderable mounting studs as disclosed in U.S. Pat. No. 4,403,102 entitled Heat Sink Mounting issued Sept. 6, 1983 to Jordan, et al. may be utilized as the mounting means in the apparatus of the invention. The studs are similar to the solderable nuts but include an upwardly extending threaded shaft. It will be recognized that either solderable nuts 46 or solderable studs may be adapted for soldering directly on the surface of the printed circuit board as previously described with respect to the leads of the electronic device package. In any case, the solderable mounting means securely mount the frame 32 and the electronic device package on the printed circuit board, thus relieving the leads 16 of the electronic device package from bearing the mechanical load of the frame and electronic device package.

Various means may be used to secure the clip 50 to the frame 32. As illustrated, the clip 50 extends over the heat sink and has an aperture 52 formed in each end thereof aligned with the solderable nuts 46. Screws 54 passing through the apertures 52 mate with the solderable nuts 46 and thus may be used to secure the assembly together and force the post 28 of the heat sink into intimate physical and thermal contact with the electronic device package. Alternatively, other clip-like members may be secured directly to the frame and the latching member utilized to support the solderable mounting studs. Similarly, the latching members 44 may be omitted and the solderable mounting studs mounted directly in the frame. The securing members may also take the form of rivets or the like rather than screws as illustrated.

In an alternate (not shown) embodiment of the invention the heat sink clip includes an intermediate arcuate section. The arcuate section includes an internal diameter which is at least equal to the outer diameter of the post of the finned heat sink 24. The heat sink clip is inserted between a pair of the fins 28 so that the arcuate section engages the post 28 of the heat sink and urges the heat sink downwardly into contact with the gate array package. The height of the heat sink clip is determined by the length of the securing members. In all other respects this embodiment of the heat sink clip functions as described hereinabove.

Preferably, the heat sink clip 50 exerts a resilient force on the finned heat sink urging it into intimate physical contact with the pad 20. The heat sink clip may be quickly and easily disassembled from the frame by disengaging the securing members from the solderable mounting studs. The location of the latching members 44 at opposite corners of the frame is advantageous in situations where two or more gate arrays are mounted on a printed circuit board or the like in close proximity. In such cases, the distance between adjacent frames may be minimized by offsetting opposing latching members. That is, the latching members are located on opposite corners of adjacent frames so that the distances the latching members protrude from their respective frames overlap instead of being additive. However, such an arrangement is not required for the apparatus of this invention.

One of the advantages of the apparatus of this invention is that the electronic device package may be loaded into the frame and the assembly positioned on a printed circuit board with the leads of the electronic device package and the mounting means of the frame located on their respective preformed locations on the printed circuit board. This assembly may then be secured to the printed circuit board through conventional mass soldering techniques, thus permitting subsequent assembly of the heat sink and the heat sink clip to the electronic device package and frame as hereinabove described. If the heat sink is secured to the electronic device package before mounting the electronic device package to the printed circuit board, the electronic device package must be mounted by hand since the heat sink would dissipate the heat required for soldering too rapidly for conventional mass soldering techniques such as flow or wave soldering. Although the invention has been described with regard to particular and preferred embodiments, these are advanced for illustrative purposes only and are not intended to limit the scope of the invention. For instance, the term "solderable stud" for purposes of the invention not only includes solderable nuts and studs as described herein but also encompasses threaded studs as shown in U.S. Pat. No. 4,403,102. In such a case the securing member 54 would take the form of a threaded nut (not shown) for engaging the ends of the threaded stud projecting through aligned holes 52 above the heat sink clip for securing the heat sink clip to the frame and the heat sink to the electronic device package. Although a gate array package and finned heat sink are shown, the invention is equally applicable to any electronic device package and heat sink design. Also, it is within the spirit and scope of the invention to provide apparatus for mounting electronic device packages on printed circuit boards and other circuit media without the use of a heat sink. In such cases the clip is adapted to contact the top side of the electronic device package directly to secure the package to the frame. If desired, the securing members could engage the frame and not the latching members or solderable mounting studs. These variations remain within the spirit and scope of invention as defined by the appended claims.

What is claimed:

1. Apparatus mounting an assembly comprising a heat sink and an electronic device package having a plurality of downwardly depending leads on a printed circuit board having a plurality of preformed locations receiving the leads of the electronic device package comprising:
   (a) frame means defining a cavity receiving the electronic device package having said plurality of downwardly depending leads with said leads extending through said frame means;
   (b) clip means engaging said heat sink;
   (c) means securing said clip means to said frame means and urging said heat sink into intimate thermal contact with the electronic device package; and
   (d) means solderably mounting said frame means on said printed circuit board with the leads of the electronic device package received by said preformed locations on the printed circuit board.

2. Apparatus as defined in claim 1 wherein said means solderably mounting comprises at least one solderable mounting stud projecting from said frame soldered to a preformed location on the printed circuit board.

3. Apparatus as defined in claim 1 wherein said means securing said clip means comprises at least one securing member extending through an aperture in said clip means and engaging said frame means to urge the clip means into contact with the heat sink.

4. Apparatus as defined in claim 3 wherein said means securing said clip means includes a screw threadedly engaging said frame means.

5. Apparatus mounting a finned heat sink on a gate array package comprising:
   (a) frame means including a pair of spaced latching members and defining an open cavity receiving said gate array package about the perimeter thereof with the leads of the gate array package extending downwardly through said cavity;
   (b) solderable mounting means securing said frame means to a preformed location on a printed circuit board;
   (c) clip means extending between said latching members above said frame means and contacting the heat sink positioned on the gate array package; and
   (d) means securing said clip means to said latching members urging the heat sink into intimate thermal contact with the gate array package.

6. Apparatus as defined in claim 5 wherein said clip means comprises an elongated body extending across said cavity of said frame means and includes a pair of apertures, and wherein said means securing said clip means comprises a screw located in each of said apertures threadedly engaging said latching members to secure said clip means in intimate thermal contact with the heat sink.

7. Apparatus as defined in claim 5 wherein said solderable mounting means securing said frame means to said printed circuit board comprises solderable attachment means mounted in each of said latching members.

8. Apparatus as defined in claim 7 wherein said solderable mounting means comprises a pair of solderable nuts mounted on said latching members and extending downwardly therefrom and soldered to preformed locations on said circuit board and wherein said means securing said clip means are screws threadedly received by the solderable nuts and the clip means is thereby secured to the frame means.

9. The combination comprising:
   (a) a printed circuit board;
   (b) frame means having a cavity and a pair of spaced latching members;
   (c) a gate array package located in said cavity with a plurality of leads extending downwardly through said cavity and mounted on preformed locations on said printed circuit board;
   (d) a finned heat sink including a post having one end in contact with an upper surface of the gate array package and a plurality of spaced radially extending fins mounted on said post;
   (e) clip means extending across said cavity and in contact with said finned heat sink including a pair of spaced apertures aligned with said latching members;
   (f) securing members extending downwardly through the apertures in said clip means and engaging said latching members to secure said heat sink to said frame means and urge said finned heat sink into intimate thermal contact with said gate array package; and
   (g) mounting means projecting from said frame means and soldered to preformed locations on said printed circuit board.

10. The combination set forth in claim 9 wherein said mounting means comprises solderable nuts mounted in said frame means.

11. The combination set forth in claim 9 wherein said mounting means comprises solderable mounting means mounted in said latching members.

12. The combination set forth in claim 9 wherein said spaced latching members project laterally from said frame means.

13. The combination comprising:
   (a) a printed circuit board;
   (b) frame means having a cavity and a pair of spaced latching members;
   (c) an electronic device package located in said cavity with a plurality of leads extending downwardly through said cavity and mounted on preformed locations on said printed circuit board;
   (d) a finned heat sink in contact with a surface of the electronic device package;
   (e) clip means extending across said cavity and in contact with said finned heat sink including a pair of spaced apertures aligned with said latching members;
   (f) securing members extending downwardly through the apertures in said clip means and engaging said latching members to secure said heat sink to said frame means and urge said finned heat sink into intimate thermal contact with said electronic device package; and
   (g) mounting means projecting from said frame means and soldered to preformed locations on said printed circuit board.

14. The combination set forth in claim 13 wherein said mounting means comprises solderable nuts mounted in said frame means.

15. The combination set forth in claim 13 wherein said mounting means comprises solderable mounting means mounted in said latching members.

16. The combination set forth in claim 13 wherein said spaced latching members project laterally from said frame means.

17. Apparatus for mounting an assembly comprising a heat sink and an electronic device package having a plurality of downwardly depending leads on a printed circuit board having a plurality of preformed locations for receiving the leads of the electronic device package, said apparatus comprising:
 (a) frame means defining a cavity adapted to receive and position therewithin an electronic device package having a plurality of downwardly depending leads with said leads passing through said cavity and extending from said frame means;
 (b) clip means adapted to engage a heat sink;
 (c) means adapted to secure said clip means to said frame means and to urge said heat sink into intimate thermal contact with said electronic device package; and
 (d) means for solderably mounting said frame means on a printed circuit board with the leads of the electronic device package extending through said cavity received by preformed locations on said printed circuit board.

18. Apparatus as defined in claim 17 wherein said means for solderably mounting comprise at least one solderable mounting stud projecting from said frame for soldering to a preformed location on the printed circuit board.

19. Apparatus as defined in claim 17 wherein said means adapted to secure said clip mans comprises at least one securing member extending through an aperture in said clip means and engaging said frame means to urge the clip means into contact with the heat sink.

20. Apparatus as defined in claim 19 wherein said means adapted to secure said clip means includes a screw threadedly engaging said frame means.

21. Apparatus for mounting a finned heat sink on a gate array package, said apparatus comprising:
 (a) frame means including a pair of spaced latching members and defining an open cavity adapted to receive a gate array package about the perimeter thereof and position said gate array package therewithin with its leads extending downwardly from said cavity;
 (b) solderable mounting means for securing said frame means to a preformed location on a printed circuit board;
 (c) clip means extending between said latching members above said frame means and adapted to contact a heat sink positioned on the gate array package; and
 (d) means for securing said clip means to said latching members to urge said heat sink into intimate thermal contact with said gate array package.

22. Apparatus as defined in claim 21 wherein said clip means comprises an elongated body extending across said cavity of said frame means and includes a pair of apertures, and wherein said means for securing said clip means comprises a screw located in each of said apertures threadedly engaging said latching members to secure said clip means in intimate thermal contact with the heat sink.

23. Apparatus as defined in claim 21 wherein said solderable mounting means comprises solderable attachment means mounted in each of said latching members.

24. Apparatus as defined in claim 23 wherein said solderable mounting means comprises a pair of solderable nuts mounted on said latching members and extending downwardly therefrom for soldering to preformed locations on circuit media and wherein said means for securing said clip means are screws threadedly received by the solderable nuts for securing the clip means to the frame means.

* * * * *

UNITED STATES PATENT AND TRADEMARK OFFICE
CERTIFICATE OF CORRECTION

PATENT NO. : 5,019,940
DATED : May 28, 1991
INVENTOR(S) : Donald L. Clemens It is certified that error appears in the above-identified patent and that said Letters Patent is hereby corrected as shown below:

Column 1, line 11, "an" should read ---and---
Column 1, line 18, after "with" insert ---a---
Column 5, line 46, delete "the" (first occurrence)
Column 7, line 39, "mans" shold read ---means---

Signed and Sealed this

Twenty-second Day of December, 1992

*Attest:*

DOUGLAS B. COMER

*Attesting Officer*     *Acting Commissioner of Patents and Trademarks*